(12) United States Patent
Chiou et al.

(10) Patent No.: US 8,703,409 B2
(45) Date of Patent: Apr. 22, 2014

(54) METHOD FOR FORMING A MICROSTRUCTURE

(75) Inventors: Da-Ren Chiou, Taipei (TW); Wei-Che Hung, Taipei (TW); Shoh-Yue Lin, Taipei (TW); Chiu-Fang Chen, Taipei (TW); Tzu-Ying Chen, Taipei (TW)

(73) Assignee: Far Eastern New Century Corporation, Taipei (TW)

( * ) Notice: Subject to any disclaimer, the term of this patent is extended or adjusted under 35 U.S.C. 154(b) by 79 days.

(21) Appl. No.: 13/231,863

(22) Filed: Sep. 13, 2011

(65) Prior Publication Data

US 2012/0114903 A1     May 10, 2012

(30) Foreign Application Priority Data

Nov. 5, 2010 (TW) ................................. 99138132 A

(51) Int. Cl.
*G03F 7/26* (2006.01)
(52) U.S. Cl.
USPC ............ 430/325; 430/394; 430/328; 430/322
(58) Field of Classification Search
USPC ................................... 430/322, 394, 328, 312
See application file for complete search history.

(56) References Cited

U.S. PATENT DOCUMENTS

| | | | | |
|---|---|---|---|---|
| 6,020,107 | A * | 2/2000 | Niiyama et al. | 430/296 |
| 6,036,579 | A | 3/2000 | Cook et al. | |
| 6,541,182 | B1 * | 4/2003 | Louis Joseph Dogue et al. | 430/296 |
| 2002/0096666 | A1 * | 7/2002 | Ichikawa et al. | 252/500 |

FOREIGN PATENT DOCUMENTS

| | | |
|---|---|---|
| EP | 1905792 | 4/2008 |
| JP | 2006-243097 | 9/2006 |
| JP | 2006-278362 | 10/2006 |
| JP | 2007-012970 | 1/2007 |
| JP | 2011032410 | * 2/2011 |
| KR | 10-0191085 | 6/1999 |
| TW | I222925 | 11/2004 |
| WO | 2006/038392 | 4/2006 |
| WO | 2007/007803 | 1/2007 |

OTHER PUBLICATIONS

Office action dated Jul. 8, 2013 from corresponding Japanese Patent Application No. 2011-210639 along with its English translation provided by Google Translator Toolkit.
Office action dated Jul. 25, 2013 from corresponding Korean Patent Application No. 10-2011-0114322 with the English summary provided by the clients.

* cited by examiner

*Primary Examiner* — Cynthia Kelly
*Assistant Examiner* — Caleen Sullivan
(74) *Attorney, Agent, or Firm* — Ladas & Parry, LLP

(57) ABSTRACT

A method for forming a microstructure includes: (a) forming a photocurable layer on a substrate, the photocurable layer including at least one photocurable compound that has a photocurable functional group equivalent weight ranging from 70 to 700 g/mol; (b) covering partially the photocurable layer using a patterned mask; (c) exposing the photocurable layer through the patterned mask using a first light source so that the photocurable layer is cured at first regions which are exposed; (d) removing the patterned mask; and (e) illuminating the photocurable layer using a second light source to cure second regions of the photocurable layer which have not been cured. The first and second regions have different surface heights and provide a surface roughness for the microstructure.

17 Claims, 2 Drawing Sheets

METHOD FOR FORMING A MICROSTRUCTURE

CROSS-REFERENCE TO RELATED APPLICATIONS

This application claims priority to Taiwanese Patent Application No. 099138132 filed on Nov. 5, 2010, the disclosure of which is incorporated herein by reference.

BACKGROUND OF THE INVENTION

1. Field of the Invention

This invention relates to a method for forming a microstructure, more particularly to a method for forming a surface with a microstructure without using any mechanical or chemical means to contact the surface.

2. Description of the Related Art

A microstructure can be found in an optoelectronic device, such as a display, a touch panel, a sensor, an electronic paper, an optical element, an integrated circuit element, etc.

Nowadays, the microstructure may be formed by treating a surface using photolithography etching, hot embossing, or mechanical processing. Each of the conventional methods involves a treatment of the surface using mechanical or chemical means to contact the surface.

For example, when using the photolithography etching method (including chemical means) as disclosed in U.S. Pat. No. 6,036,579, an etchant used for forming the microstructure is expensive, and may cause environmental pollution.

When using the hot embossing method (including mechanical means) as disclosed in Taiwanese patent no. I222925, precision and roughness of the microstructure may be adversely affected due to unevenness of an embossing force applied to the surface to be formed with the microstructure. Thus, such method may have a relatively poor yield.

When using a tool, such as a cutter, to conduct the mechanical processing method (including mechanical means), the yield may be reduced due to deformation of the tool. Besides, the microstructure formed by this method may have residues left thereon.

SUMMARY OF THE INVENTION

Therefore, an object of the present invention is to provide a method for forming a microstructure that can overcome the aforesaid drawbacks associated with the prior art.

Accordingly, a method for forming a microstructure of this invention comprises:

(a) forming a photocurable layer on a substrate, the photocurable layer including at least one photocurable compound that has a plurality of photocurable functional groups and a photocurable functional group equivalent weight ranging from 70 to 700 g/mol;

(b) covering partially the photocurable layer using a patterned mask;

(c) exposing the photocurable layer through the patterned mask using a first light source so that the photocurable layer is cured at first regions which are exposed;

(d) removing the patterned mask; and (e) illuminating the photocurable layer using a second light source to cure second regions of the photocurable layer which have not been cured;

wherein the first and second regions have different surface heights and provide a surface roughness for the microstructure

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
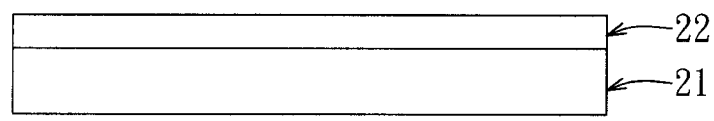
FIGS. 1 to 5 are schematic side views illustrating consecutive steps of a method for forming a microstructure according to the preferred embodiment of the present invention.
Figure 2:
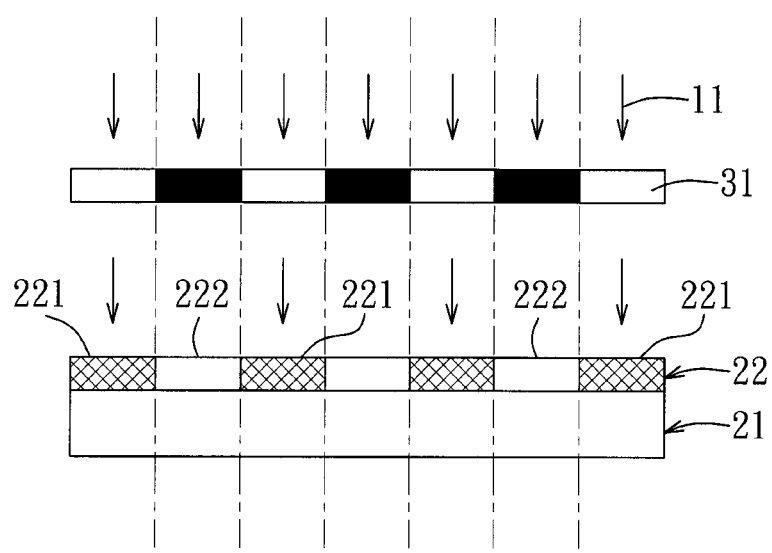
Figure 3:
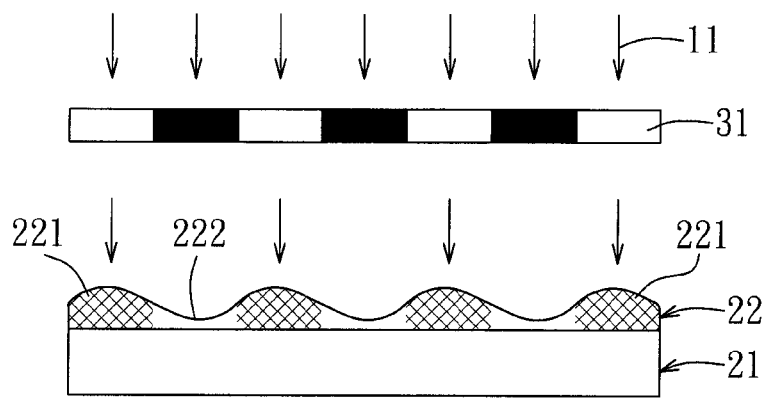
Figure 4:
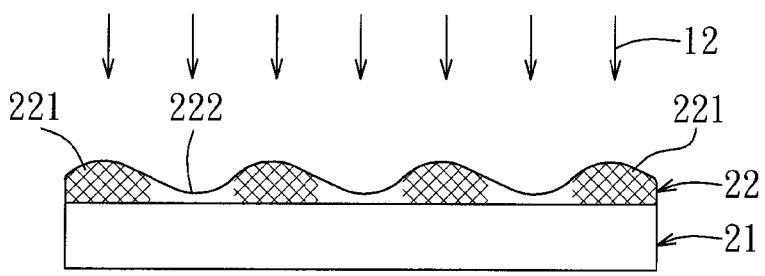
Figure 5:
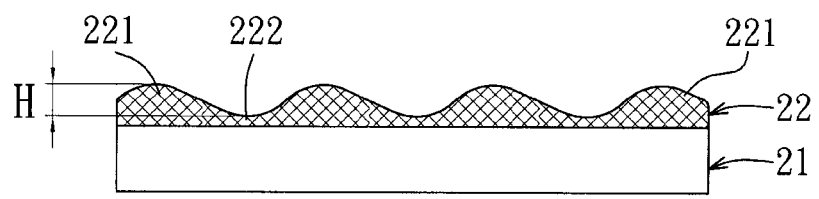

Referring to FIGS. 1 to 5, the preferred embodiment of a method for forming a microstructure of this invention comprises:

(1) coating a substrate 21 with a paste to form a paste layer (not shown), the paste including at least one photocurable compound and a solvent;

(2) drying the paste layer to remove the solvent from the paste layer and to form a photocurable layer 22 on the substrate 21 (see FIG. 1);

(3) covering partially the photocurable layer 22 using a patterned mask 31;

(4) exposing the photocurable layer 22 through the patterned mask 31 using a first light source 11 so that the photocurable layer 22 is cured (i.e., cross-linked) at first regions 221 which are exposed (see FIGS. 2 and 3);

(5) removing the patterned mask 31 (see FIG. 4); and (6) illuminating the photocurable layer 22 using a second light source 12 to cure second regions 222 of the photocurable layer 22 which have not been cured in the step (4) (see FIGS. 4 and 5).

The first and second regions 221, 222 have different surface heights and provide a surface roughness (Rz) for the microstructure.

In the step (1), the process for coating the paste over the substrate 21 may be conducted by, but is not limited to, spin coating, bar coating, dip coating, slot die coating, or roll to roll coating, etc.

In the step (4), when the photocurable layer 22 is exposed through the patterned mask 31 to the first light source 11 (see FIG. 2), the first regions 221 of the photocurable layer 22 have a reduced concentration of unreacted photocurable compound. Therefore, the unreacted photocurable compound in the second regions 222 of the photocurable layer 22 has a relatively high concentration. Since a material tends to diffuse from the zone of high concentration toward that of low concentration, the unreacted photocurable compound in the second regions 222 flows toward the exposed first regions 221. As shown in FIG. 3, after the step (4), the photocurable layer 22 protrudes in the first regions 221, and is indented in the second regions 222.

The material of the patterned mask 31 is not limited, so long as the patterned mask 31 has one or more light-transmissive regions for passage of light from the first light source 11, and one or more light impermeable regions for blocking, absorbing, or reflecting light from the first light source 11.

In the step (3), the patterned mask 31 may be disposed above the photocurable layer 22 or under the substrate 21 to cover partially the photocurable layer 22. When the patterned mask 31 is disposed under the substrate 21, the substrate 21 should be light-transmissive so that the light from the first light source 11 sequentially passes through the patterned mask 31 and the substrate 21 to expose the photocurable layer 22. Preferably, the photocurable compound has a plurality of photocurable functional groups, which should not be limited so long as they are photocurable. Examples of the photocurable functional group include an alkenyl group, an epoxy group, etc. When the alkenyl groups are included, the photocurable compound may be, but is not limited to, an acrylic-based compound, an ether-based compound including a vinyl group, a styrene-based compound, a thiolene-based compound, etc.

The photocurable compound may be a monomer, an oligomer, or a combination thereof. The molecular weight of the photocurable compound is not limited, as long as the photocurable compound has a photocurable functional group equivalent weight of not less than 70 g/mol.

The photocurable functional group equivalent weight of the photocurable compound is defined by the molecular weight of the photocurable compound divided by the number of the photocurable functional groups. The smaller the photocurable functional group equivalent weight of the photocurable compound, the more active will be the curing of the photocurable layer 22, and thus, the unreacted photocurable compound in the second regions 222 flows toward the first regions 221 faster. The photocurable functional group equivalent weight of the photocurable compound ranges preferably from 70 to 700 g/mol, more preferably from 80 to 600 g/mol, and most preferably from 85 to 400 g/mol.

After the step (6), the surface roughness (Rz) of the microstructure is determined by a ten-point average value of surface height differences (H) (see FIG. 5) among two adjacent ones of the cured first and second regions 221, 222 using a probing surface roughness meter (available from KOSAKA Laboratory Ltd., Japan, Model No. ET4000A). Based on the practical requirements, the surface roughness (Rz) of the microstructure of this invention can be adjusted by the photocurable functional group equivalent weight of the photocurable compound and by an exposure dosage of the first light source 11. Preferably, the surface roughness (Rz) of the microstructure is not less than 0.05 μm, more preferably ranging from 0.15 μm to 8 μm, and most preferably ranging from 0.2 μm to 7 μm.

Preferably, the photocurable layer 22, in the step (2), further includes a photoinitiator (i.e., the paste also includes the photoinitiator).

The solvent may be any one that can sufficiently dissolve the photocurable compound and the photoinitiator, and may be selected from alcohols, ketones, esters, halogenated solvents, hydrocarbons, etc. For example, acetone, acetonitrile, chloroform, chlorophenol, cyclohexane, cyclohexanone, cyclopentanone, dichloromethane, diethyl acetate, dimethyl carbonate, ethanol, ethyl acetate, N,N-dimethyl acetamide, 1,2-propanediol, 2-hexanone, methanol, methyl acetate, butyl acetate, toluene, tetrahydrofuran, etc.

The photoinitiator used in the paste can be any one that may facilitate a photocuring reaction of the photocurable compound, and may be selected from the group consisting of vinyl phenone derivatives, benzophenone derivatives, Michler's ketone, benzyne, benzyl derivatives, benzoin derivatives, benzoin methyl ether derivatives, α-acyloxy ester, thioxanthone derivatives, and anthraquinone derivatives. The amount of the photoinitiator used in the paste is not limited, and is preferably not less than 0.01 wt % based on a total weight of the photocurable compounds.

Preferably, the first light source 11 may be UV light, visible light, an electron beam, or an X-ray, and the UV light is more preferable. The exposure dosage of the first light source 11 is not limited. In general, the higher the exposure dosage, the better will be the formation of the microstructure. However, the high exposure dosage results in relatively high energy consumption and cost. If the exposure dosage is too low, the curing time for the photocurable compound is relatively long. In consideration of the cost and the curing time, the exposure dosage of the first light source 11 is preferably not less than 70 mJ/cm², and more preferably ranges from 100 mJ/cm² to 650 mJ/cm². Additionally, the second light source 12 may also be UV light, visible light, electron beam, or X-ray, and the UV light is more preferable. The exposure dosage of the second light source 12 is not limited as long as the photocurable layer 22 (especially the second regions 222) can be fully cured. Besides, the first and second light sources 11, 12 may be the same or different.

The present invention is explained in more detail below by way of the following examples. It should be noted that the examples are only for illustration and not for limiting the scope of the present invention.

Example 1

0.4 g of an acrylic-based photocurable compound having a photocurable functional group equivalent weight of 88 g/mol (pentaerythritol tetraacrylate, available from Kyoeisha Chemical Co., Ltd., trade name: PE4A) was mixed with 0.6 g of toluene and 0.02 g of a photoinitiator (available from Ciba, trade name: I-184) to obtain a paste (1.02 g) having a solid content of 40%. Particularly, the photocurable compound of PE4A is represented by the following chemical formula (I):

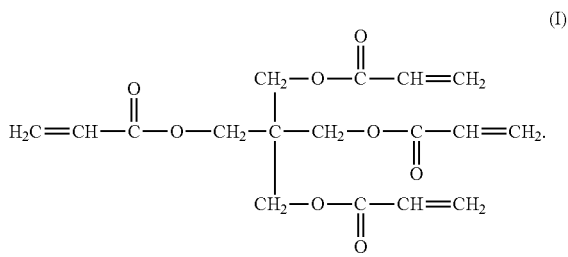 [SMILES: C=CC(=O)OCC(COC(=O)C=C)(COC(=O)C=C)COC(=O)C=C]

The paste was dropped on a polyester-based substrate (available from Toyobo Co., Ltd., trade name: A4300, 5 cm×5 cm×100 μm), and the paste was evenly distributed on the substrate using spin coating at a speed of 500 rpm for 40 seconds. Then, the substrate coated with the paste was disposed in an oven maintained at 80° C. for 3 minutes to remove the solvent (i.e., toluene), and subsequently moved to another oven maintained at 100° C. to anneal for 2 minutes, followed by cooling to room temperature to form the photocurable layer having a thickness of 4.65 μm on the substrate. A patterned mask having a line spacing of 110 μm and a line width of 110 μm was disposed on the photocurable layer. The photo curable layer was exposed to a first UV light source (the first light source 11) having an exposure dosage of 650 mJ/cm² using an UV exposure machine (available from US Fusion) in a nitrogen atmosphere. Thereafter, the exposed first regions of the photocurable layer were formed as cured protruded regions, and the unexposed second regions were formed as uncured indented regions. After the patterned mask was removed, the photocurable layer was further exposed to a second UV light source (the second light source 12) having an exposure dosage of 450 mJ/cm² in a nitrogen atmosphere. All of the first and second regions were cured to have different surface heights and to obtain the microstructure. The surface roughness (Rz) of the microstructure measured using the probing surface roughness meter (available from KOSAKA Laboratory Ltd., Model No. ET4000A) was 3.56 μm.

Examples 2~5 and Comparative Example 1 (CE1)

In Examples 2~5 and Comparative Example 1, the microstructures were prepared and evaluated following the procedure employed in Example 1 except that, in the photocurable layers of Examples 2~5 and Comparative Example 1, the photocurable functional group equivalent weights of the photocurable compounds are different. The photocurable functional group equivalent weights of the photocurable compounds used in Examples 2~5 are respectively 96.3 g/mol (available from Cognis, trade name: 4600), 99.3 g/mol (available from Sartomer, trade name: SR444), 132 g/mol (available from Cognis, trade name: 4172F), and 400 g/mol (available from Sartomer, trade name: CN9006). The photocurable functional group equivalent weights of the photocurable compounds used in Comparative Example 1 was 750 g/mol (available from Double Bond Chemical Ind., Co., Ltd., trade name: DOUBLEMER® 176-TE, acrylic-based polymer). The results of the surface roughness (Rz) of the microstructure for each of Examples 2~5 and Comparative Example 1 are listed in Table 1.

The photocurable compounds of 4600, SR444, 4172F are respectively represented by the following chemical formulas (II), (III), and (IV):

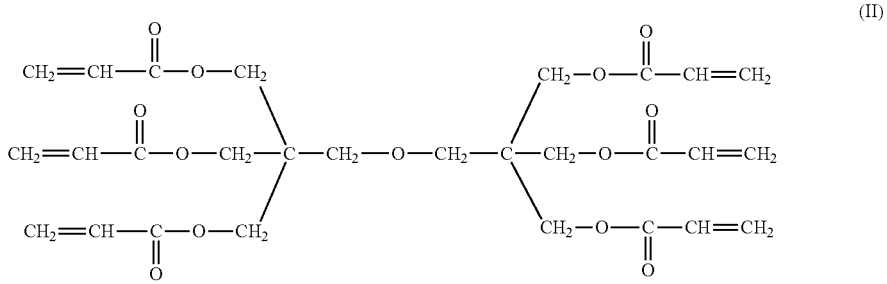

(II)

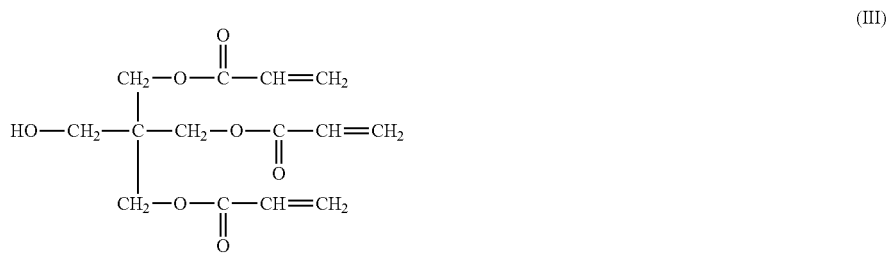

(III)

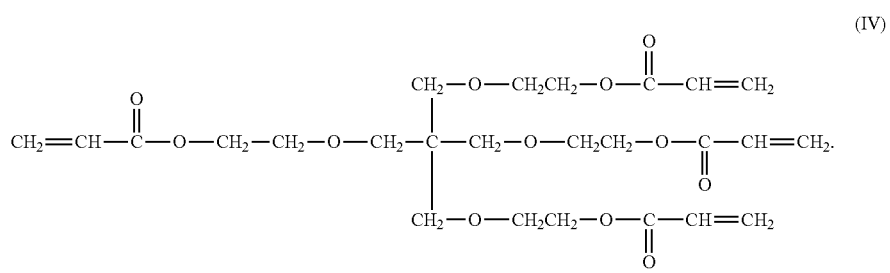

(IV)

Examples 6~7 and Comparative Example 2 (CE2)

In Examples 6~7 and Comparative Example 2, the microstructures were prepared and evaluated following the procedure employed in Example 1 except that the applied exposure dosage of the first light source 11 for each of Examples 6~7 and Comparative Example 2 is as listed in Table 1. The results of the surface roughness (Rz) of the microstructure for each of Examples 6~7 and Comparative Example 2 are listed in Table 1.

Example 8

In Example 8, the microstructures were prepared and evaluated following the procedure employed in Example 3 except that, (1) the paste was evenly distributed on the substrate using spin coating at a speed of 800 rpm for 40 seconds; and (2) the photocurable layer was formed to have a thickness of 9.01 μm on the substrate. The result of the surface roughness (Rz) of the microstructure for Example 8 is listed in Table 1. The thickness of the photocurable layer was mainly controlled by the speed for spin coating.

Example 9

In Example 9, the microstructures were prepared and evaluated following the procedure employed in Example 3, expect that, (1) the paste was evenly distributed on the substrate by spin coating at a speed of 500 rpm for 30 seconds; and (2) the photocurable layer was formed to have a thickness of 5.2 μm on the substrate.

Example 10

In Example 10, the microstructure was prepared and evaluated following the procedure employed in Example 1 except that, (1) the paste was evenly distributed on the substrate by spin coating at a speed of 500 rpm for 30 seconds; and (2) the photocurable layer was formed to have a thickness of 5.3 μm on the substrate.

TABLE 1

|  | Equivalent* | Thickness* (μm) | $1^{st}$ exposure dosage* (mJ/cm$^2$) | $2^{nd}$ exposure dosage* (mJ/cm$^2$) | Rz (μm) |
| --- | --- | --- | --- | --- | --- |
| EX1 | 88 | 4.65 | 650 | 450 | 3.56 |
| EX2 | 96.3 | 4.62 | 650 | 450 | 2.74 |
| EX3 | 99.3 | 4.63 | 650 | 450 | 2.63 |
| EX4 | 132 | 4.6 | 650 | 450 | 0.41 |
| EX5 | 400 | 4.59 | 650 | 450 | 0.21 |
| EX6 | 88 | 4.63 | 350 | 450 | 2.88 |
| EX7 | 88 | 4.62 | 100 | 450 | 1.17 |
| EX8 | 99.3 | 9.01 | 650 | 450 | 6.96 |
| EX9 | 99.3 | 5.2 | 650 | 450 | 3.01 |
| EX10 | 88 | 5.3 | 650 | 450 | 4.03 |
| CE1 | 750 | 4.61 | 650 | 450 | <0.05 |
| CE2 | 88 | 4.67 | 50 | 450 | <0.05 |

*"Equivalent" means the photocurable functional group equivalent weights (in g/mol) of the photocurable compound in the photocurable layer.
*"Thickness" means the thickness of the uncured photocurable layer.
*"The first exposure dosage" means the exposure dosage of the first light source.
*"The second exposure dosage" means the exposure dosage of the second light source.

According to the results of Examples 2-5 and Comparative Example 1 shown in Table 1, under the same exposure dosages of the first and second light sources 11, 12 and the similar thickness of the uncured photocurable layer, the lower the photocurable functional group equivalent weights of the photocurable compound in the photocurable layer, the greater will be the Rz value. When the photocurable functional group equivalent weight of the photocurable compound is greater than 700 g/mol (see Comparative Example 1), the surface roughness (Rz) of the microstructure is as low as less than 0.05 μm. Such low Rz value may have resulted from insufficient flow of the second regions 222 of the photocurable layer 22 to the first regions 221 during irradiation of the first light source 11.

Besides, according to the results of Examples 1, 6 and 7 and Comparative Example 2 shown in Table 1, under the same exposure dosage of the second light source 12, the same photocurable functional group equivalent weight of the photocurable compound in the photocurable layer 22, and the similar thickness of the uncured photocurable layer, the greater the exposure dosage of the first light source 11, the greater will be Rz value. When the exposure dosage of the first light source 11 is lower than 70 mJ/cm$^2$ (see Comparative Example 2), since the first region 221 is cured in a relatively low speed, the unreacted photocurable compound in the second regions 222 flows toward the first region 221 slower. Accordingly, the surface roughness (Rz) of the microstructure is as low as less than 0.05 μm.

According to the results of Examples 1 and 10 and the results of Example 3, 8 and 9 shown in Table 1, under the same exposure dosages of the first and second light sources 11, 12, and the same photocurable functional group equivalent weight of the photocurable compound in the photocurable layer 22, the greater the thickness of the uncured photocurable layer, the greater will be Rz value.

Therefore, it has been demonstrated that, according to the method of this invention, the microstructure with a desirable Rz value can be obtained by controlling the photocurable functional group equivalent weight of the photocurable compound(s) in the photocurable layer 22 and the exposure dosage of the first light source 11.

Besides, when the photocurable functional group equivalent weight of the photocurable compound(s) falls within a range limited according to the present invention, the Rz value of the microstructure can be controlled by adjusting the thickness of the photocurable layer. The Rz value can increase as the thickness of the photocurable layer increases. This is because, when the photocurable layer has a large thickness, more amount of the unreacted photocurable compound can flow toward the exposed first regions 221 (FIG. 3) to create surfaces protrusions.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for forming a microstructure, comprising:
    (a) forming a layer of photocurable material on a substrate, the photocurable material being constituted by at least one photocurable compound and having a plurality of photocurable molecules;
    (b) providing a patterned mask having a plurality of light-transmissive regions and a plurality of light-impermeable regions;
    (c) disposing the patterned mask above the photocurable material layer such that the light-transmissive regions are in register with first regions of the photocurable material layer and the light-impermeable regions are in register with second regions of the photocurable material layer;

(d) irradiating the first regions of the photocurable material layer through the light-transmissive regions of the patterned mask using a first light source to permit the photocurable molecules in the first regions to undergo a cross-linking reaction such that the photocurable molecules in the first regions have a reduced concentration which causes the photocurable molecules in the second regions to diffuse into the first regions, thereby raising a profile of the first regions;

(e) removing the patterned mask; and (f) irradiating the photocurable material layer using a second light source to permit the photocurable molecules remaining in the first and second regions to undergo a cross-linking reaction, thereby obtaining a microstructure having a surface roughness.

2. The method of claim 1, wherein the first light source is UV light, visible light, electron beam, or X-ray.

3. The method of claim 1, wherein the second light source is UV light, visible light, electron beam, or X-ray.

4. The method of claim 1, wherein the first light source is UV light and has an exposure dosage of not less than 70 mJ/cm$^2$.

5. The method of claim 1, wherein the photocurable compound includes a plurality of photocurable functional groups, and has a photocurable functional group equivalent weight ranging from 70 to 700 g/eq.

6. The method of claim 5, wherein the photocurable functional group equivalent weight of the photocurable compound ranges from 85 to 400 g/eq.

7. The method of claim 5, wherein the photocurable functional groups are selected from the group consisting of an alkenyl group and an epoxy group.

8. The method of claim 5, wherein the photocurable functional group equivalent weight of the photocurable compound ranges from 80 to 600 g/eq.

9. The method of claim 1, wherein, in step (a), the photocurable material further includes a photoinitiator.

10. The method of claim 9, wherein the photoinitiator is selected from the group consisting of vinyl phenone derivatives, benzophenone derivatives, Michler's ketone, benzyne, benzyl derivatives, benzoin derivatives, benzoin methyl ether derivatives, α-acyloxy ester, thioxanthone derivatives, and anthraquinone derivatives.

11. The method of claim 1, wherein the photocurable material layer is formed by coating the substrate with a paste including the photocurable material.

12. The method of claim 11, wherein the paste further includes a solvent.

13. The method of claim 12, wherein the solvent is selected from the group consisting of acetone, acetonitrile, chloroform, chlorophenol, cyclohexane, cyclohexanone, cyclopentanone, dichloromethane, diethyl acetate, dimethyl carbonate, ethanol, ethyl acetate, N,N-dimethyl acetamide, 1,2-propanediol, 2-hexanone, methanol, methyl acetate, butyl acetate, toluene, and tetrahydrofuran.

14. The method of claim 1, wherein the surface roughness is not less than 0.05 μm.

15. The method of claim 1, wherein the surface roughness ranges from 0.15 μm to 8 μm.

16. The method of claim 1, wherein the surface roughness ranges from 0.2 μm to 7 μm.

17. The method of claim 1, wherein said patterned mask having a plurality of light-transmissive regions and a plurality of light-impermeable regions is such that the plurality of light-impermeable regions alternate with the light-transmissive regions.

* * * * *